United States Patent [19]
Murphy

[11] Patent Number: 4,585,990
[45] Date of Patent: Apr. 29, 1986

[54] LARGEST AMPLITUDE TRANSIENT DETECTOR

[75] Inventor: Hugh J. Murphy, Riverside, Calif.

[73] Assignee: Rockwell International Corporation, El Segundo, Calif.

[21] Appl. No.: 599,406

[22] Filed: Apr. 11, 1984

[51] Int. Cl.[4] ............................................. G01R 27/28
[52] U.S. Cl. .................................. 324/102; 324/103 P
[58] Field of Search ............................ 324/102, 103 P; 328/135; 329/109; 340/659, 662

[56] References Cited

U.S. PATENT DOCUMENTS

| | | | |
|---|---|---|---|
| 3,221,253 | 11/1965 | Keyes | 324/103 P |
| 3,225,213 | 12/1965 | Hinrichs et al. | 324/103 P |
| 4,219,152 | 8/1980 | Couch et al. | 329/109 |

Primary Examiner—Reinhard J. Eisenzopf
Assistant Examiner—Vinh Nguyen
Attorney, Agent, or Firm—H. Fredrick Hamann; James F. Kirk

[57] ABSTRACT

A transient detector system for monitoring a voltage signal to detect positive and negative transient voltages on the voltage signal that penetrates a predetermined threshold band, the transient detector system being synchronized to an internal clock signal and providing first and second output signals characterizing the amplitude of the last largest respective positive transient noise signal and the last largest negative transient noise signal penetrating a threshold band. The transient detector system also provides third and fourth output signals characterizing the pulse widths of both the last largest positive and last largest negative transient noise signals. The transient detector system receives a sampled and digitized signal characterizing the instantaneous amplitude of the signal and uses a positive and negative threshold detect circuit means to recognize the presence of transient noise signals. Positive and negative compare circuit means are used to compare the present value of a transient voltage with the last largest value of transient voltage received.

6 Claims, 3 Drawing Figures

LARGEST AMPLITUDE TRANSIENT DETECTOR

The invention herein described was made in the course of or under Contract No. F04704-78-C-0021, with the Department of the Air Force.

BACKGROUND OF THE INVENTION

1. Field of the Invention

This invention relates to the field of power monitoring and quality monitoring systems and more particularly to the field of transient detector systems and particularly to the field of transient detectors having the ability to measure the peak amplitude of both positive and negative transient voltages occurring on a static signal or voltage level and, in addition, the ability to measure the pulse width of these transients.

2. Description of the Prior Art

A patent application titled "TRANSIENT DETECTOR APPARATUS" was filed by the U.S. Government having Ser. No. 452,602 on Dec. 23, 1982, the inventors being H. J. Murphy and M. L. Lapeyrolerie. The subject matter of this earlier invention solves the problem of measuring the amplitude of transient voltages present on data signals having first and second logic states. The invention of Ser. No. 452,602 is of interest because it is in the same field and has one common inventor with the present application; however, it has a block diagram topology unlike that of the present invention largest amplitude transient detector. In addition, the transient detector apparatus application having Ser. No. 452,602 does not address solving the problem of measuring the last largest positive and negative transient voltage amplitudes on the same static level and of measuring and storing the corresponding transient durations within a sample interval.

Systems are known, in the art, that characterize the amplitude of transient voltages and static voltage levels, and make this data available at a later time. These systems store only the first data item which may not be the largest transient signal to occur within the monitor period. This invention saves only information relating to the last largest positive and negative transient voltages to have been detected on a static level, within the monitoring interval.

SUMMARY OF THE INVENTION

It is a major objective of this invention to detect positive and negative transient voltages on a static voltage signal that penetrate a predetermined threshold band and to provide first and second output signals on output signal buses characterizing the amplitude of the last largest respective positive and negative transient noise signals penetrating a threshold band.

Another objective of the invention is to provide third and fourth output signals respectively characterizing the pulse width of the last largest positive and negative transient noise signals.

The invention receives an external signal from an external signal source and has an internal clock signal source. Positive and negative threshold detect circuit means are used to detect the presence of positive and negative transient voltages on a sample signal. The positive and negative threshold detect circuit means provides respective positive and negative peak transient logic signals at respective positive and negative channel peak transient select terminals to signal penetration of the predetermined threshold band by respective positive and negative transient signals. Respective positive and negative register means are provided for storing the peak values of successive respective positive and negative transient signals. Respective positive and negative channel output register storage means are provided for storing the respective values of the last largest positive and negative transient signals detected. Respective positive and negative compare circuit means are provided for comparing the respective values of positive and negative transient signals with the respective values of last largest positive and negative transient signals and for providing respective positive and negative channel width transfer control signals.

BRIEF DESCRIPTION OF THE DRAWINGS

FIG. 1a is a schematic insert on FIG. 1 depicting the voltage signals v(t) having a positive transient voltage penetrating a positive threshold and a negative transient voltage penetrating a negative threshold.

PREFERRED EMBODIMENT

Figure 1:
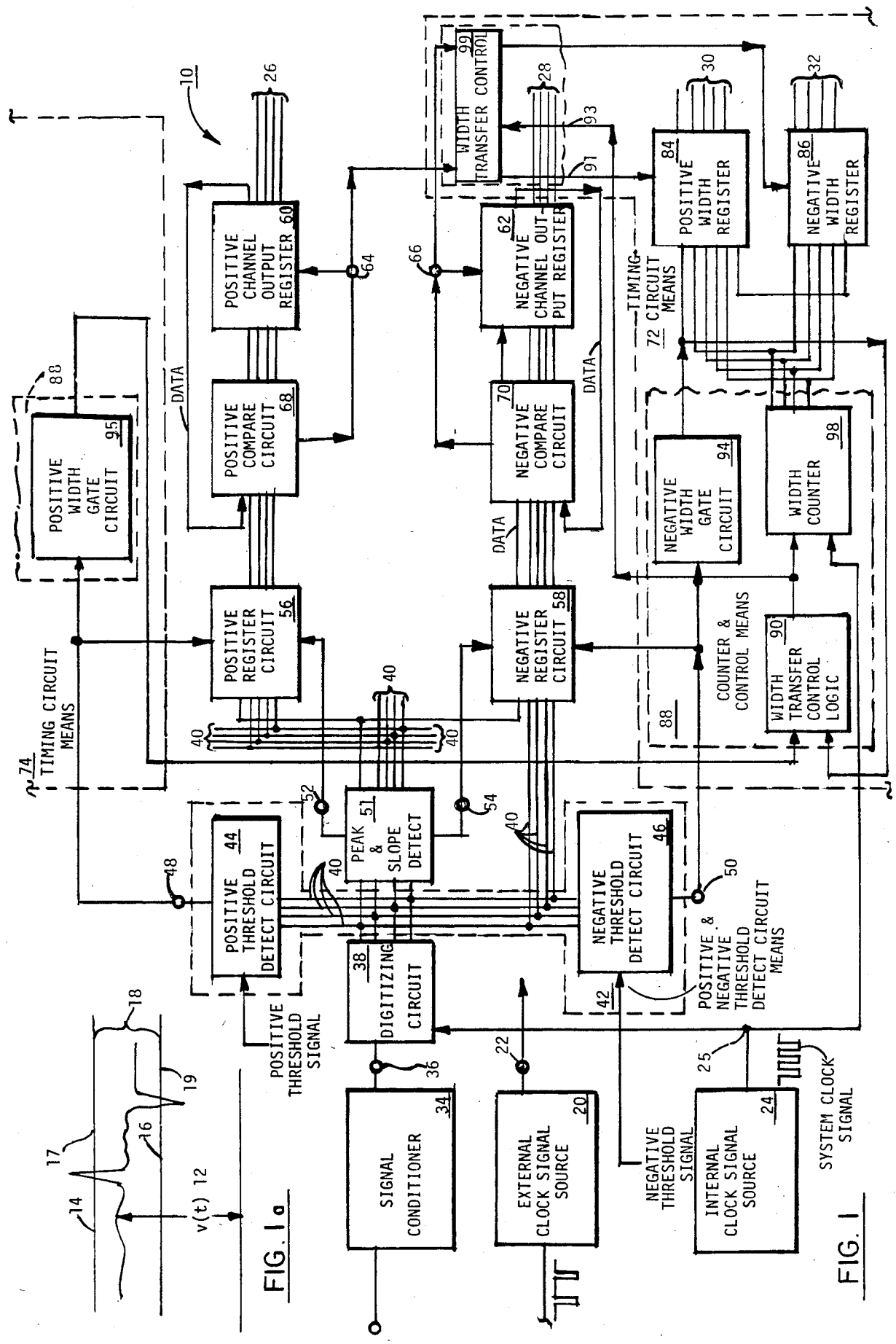
FIG. 1 is a block diagram of the invention transient detector system.

Referring now to FIG. 1, there is illustrated a block diagram of the invention transient detector system 10 for monitoring a voltage signal, v(t), 12 depicted in insert FIG. 1a as 12. The transient detector system detects positive and negative transient voltages 14, 16 on the voltage signal 12. The positive and negative transient voltages 14, 16 are shown in FIG. 1a penetrating a predetermined threshold band 18, the positive transient voltage 14 penetrating a predetermined positive threshold 17 and the negative transient voltage 16 penetrating a predetermined negative threshold 19. The transient detector system 10 receives an external clock signal from an clock signal source 20 for synchronization with an external system (not shown) at an external clock signal terminal 22. The transient detector system 10, also has a system clock signal (not shown) from an internal clock signal source 24 at a system clock signal terminal 25, for internal synchronization and control. The transient detector system 10 provides first and second output signals on first and second output signal busses 26, 28 characterizing the amplitude of the last largest respective positive and negative transient noise signal amplitudes penetrating the threshold band 18. The transient detector system 10 also provides third and fourth output signals on positive width bus 30 and on negative width bus 32 respectively characterizing the pulse width of the last largest positive and negative transient noise signals respectively.

The transient detector system 10 has a signal conditioning circuit 34 for scaling and conditioning the voltage signal v(t) and for providing a sample signal at sample signal terminal 36.

A digitizing circuit 38 receives a clock signal from clock signal source 24. Clock signal source 24 typically has a clock signal frequency that is many times higher than the system frequency. The digitizing circuit 38 samples and periodically digitizes the magnitude of the sample signal at terminal 36 for periodically providing a digital data signal (not shown) on data bus 40. Each respective data signal represents the instantaneous voltage amplitude of the sample signal at terminal 36. The sample rate of the digitizing circuit 38 is characterized to be of a sufficiently high repetition rate to substantially follow the amplitude of positive and negative transient noise signals, such as 14 and 16 depicted in FIG. 1a as being present on the sample signal at terminal 36.

Sampling the amplitude of a time varying voltage signal 12 and digitizing the amplitude of the voltage signal at a high rate is well known in the art. By way of example, a TRW 8-bit analog-to-digital converter, Model TD 1007J was used at a sample rate of 18 megahertz. The sample rate permitted by this part is limited to 35 megahertz.

A 7-bit output of the digitizing circuit 38, i.e. the TRW TD 1007J, was fed to data bus 40. Each respective data signal represents the instantaneous amplitude of the sample signal, at terminal 36.

Again referring to FIG. 1, the transient detector system comprises a positive and negative threshold detect circuit means, such as that contained within phantom block 42. The positive and negative threshold detect circuit means is responsive to the series of data amplitude signals on the data bus 40 for providing a positive threshold penetration logic signal at terminal 48 as a positive transient voltage signal, such as 15 in FIG. 1a, penetrates a predetermined positive threshold signal level, such as 17, and for providing a negative threshold penetration logic signal at terminal 50 as a negative transient voltage signal, such as 16 penetrates a predetermined negative threshold signal level, such as 19.

A slope detect circuit means 51 is responsive to the data amplitude signal, on data bus 40, for determining if the data amplitude signal is changing with a positive or negative slope with respect to time, and for providing a positive channel peak transient signal at a positive channel peak transient select terminal 52 for a positive data amplitude bus signal changing from a positive slope to a negative slope. The slope detect circuit means 51 also provides a negative channel peak transient signal at a negative channel peak transient select terminal 54 for a negative data amplitude bus signal changing from a negative slope to a positive slope.

Positive register means 56 is shown coupled to data amplitude bus 40 and is responsive to the positive threshold penetration logic signal present at positive threshold penetration logic signal terminal 48 and to the positive channel peak transient signal present at positive channel peak transient select terminal 52 for loading and storing the peak value of successive positive transient signals from data amplitude signals on the data bus 40.

A negative register means 58 is coupled to data bus 40 and is responsive to the negative threshold penetration logic signal at the negative threshold penetration logic terminal 50 and to the negative channel peak transient signal at the negative channel peak transient select terminal 54 for loading and storing the peak value of successive negative transient signals from the data amplitude signals on the data bus 40.

A positive channel output register storage means 60 for storing the peak amplitude of the last largest positive data signal and a negative channel output register storage means 62 for storing the peak amplitude of the last largest negative transient data signal are shown having a last largest positive transient noise signal data bus 26 and a last negative transient noise signal data bus 28 respectively for outputting said first output signal and said second output signal respectively.

Positive compare circuit means 68 is shown coupled to the positive register 56 and to the positive channel output register storage means 60 for comparing the peak value of successive positive transient signals with the last largest positive transient signal and for replacing the contents of the positive channel output register, the first output signal, with the contents of the positive channel register 56 when the peak value of the contents of the positive register 56 exceeds the value of the contents of the positive channel output register 60. The positive compare circuit means also provides a positive channel width transfer control signal at a positive channel transfer control terminal 64 to signal that the value of the present positive transient signal exceeds the value of the last largest positive transient signal.

Negative compare circuit means 70 is coupled to the negative register 58 and to the negative channel output register storage means 62 for comparing the peak value of successive negative transient signals with the last largest negative transient signal stored in the negative channel output register storage means 62. The negative compare circuit means 70 is characterized as replacing the contents of the absolute value of the negative channel output register storage means 62 with the contents of the negative channel register 58 when the peak negative value of the negative channel register exceeds the value of the contents of the negative channel output register. The negative compare circuit means 70 provides a negative channel width transfer control signal at a negative channel transfer control terminal 66 to signal that the absolute value of the negative transient signal exceeds the value of the absolute value of the last largest negative transient signal, the contents of negative channel output register 62 appearing as the second output signal appearing on the last negative transient noise signal data bus 28.

Timing circuit means, such as that depicted within phantom blocks 72, 74 are responsive to the positive threshold penetration logic signal and to the negative threshold penetration logic signal at terminals 48 and 50, respectively. The timing circuit means 72, 74 receives the internal clock signal from the internal clock signal source 24. The timing circuit means is characterized to measure the width of each successive positive and negative transient noise signal penetration of the predetermined threshold band and for outputting the third and fourth output signals on the positive width register bus 30 and on the negative width register bus 32, respectively, in response to the positive and negative channel width transfer control signals.

The transient detector system positive and negative channel output registers 60, 62 respectively contain the values of the amplitudes of the last largest positive and negative transient signals, and the positive and negative transient noise signal width registers 84, 86 respectively contain the respective widths of the largest last positive and negative transient signals.

In an alternative and more particular embodiment, the timing circuit means as shown in FIG. 1, within phantom blocks 72 and 74, comprises a positive transient noise signal width storage register 84 and a negative transient noise signal width storage register 86.

A counter and control means for measuring the width of each successive positive and negative transient noise signal 14, 16 that exceed the predetermined threshold band 18 as shown in FIG. 1a is responsive to the positive channel width transfer control logic signal present at positive channel transfer control terminal 64 and to the positive threshold penetration logic signal terminal 48 for transferring the value of the width of each successive positive transient noise signal from the counter means to the positive transient noise signal with storage register 84. The counter and control means is also responsive to the negative channel width transfer control logic signal present at the negative channel transfer control terminal 66 and to the negative threshold penetration logic signal present at the negative threshold penetration logic signal terminal 50 for transferring the width of each negative transient noise signal 16 that exceeds the predetermined threshold 19 from the counter means to the negative transient noise signal with storage register 86.

In a more particular alternative embodiment, the counter and control means as shown contained within phantom block 88 further comprises a width transfer control circuit 99, a positive width gate circuit 95, a negative width gate circuit 94, a width transfer control logic circuit 90, and a width counter 98.

The positive width gate circuit 95 is shown coupled to the positive threshold penetration logic signal terminal 48 and is responsive to the positive threshold penetration logic signal to provide a positive width gate signal to characterize the interval in time during which a positive transient noise signal, such as 14, is exceeding the predetermined positive threshold level 17. The negative width gate circuit 94 is coupled to the negative threshold penetration logic signal terminal 50 and is responsive to the negative threshold penetration logic signal to provide a negative width gate signal to characterize the interval in time during which the absolute value of a negative transient noise signal, such as 16, is exceeding the predetermined negative threshold level 19.

The width transfer control circuit 99 receives a positive and negative channel transfer control logic signals from terminals 64 and 66, respectively, these signals indicating that a last largest transient value has been exceeded. The width transfer control circuit 99 also receives a counter width gate signal from transfer control logic block 90 on line 93.

The width transfer control circuit 99 provides both positive and negative width transfer signals on lines 91 and 95 to the positive and negative width registers 84 and 86 to transfer the contents of the width counter 98 to the appropriate register 84, 86.

The width transfer control logic circuit 90 responds to the positive and negative width gate signals to provide a counter width gate signal.

The width gate counter is responsive to the internal clock signal shown on bus 25. This internal clock signal is typically provided at a high multiple of the system clock. The counter is enabled by the counter width gate signal to count during the time interval characterized by the presence of the counter width gate signal. The width counter 98 provides a width count output to the positive width register 84 or to the negative width register 86 in response to the counter width gate signal. The counter value is transferred in response to a positive or negative width transfer signal to positive width register 84 or negative width register 86 to store the width count for output signal purposes.

The positive and negative threshold detects circuit means 42 comprises first and second magnitude comparators 44, 46. The first and second magnitude comparators receive data signals from the data bus 40. The first magnitude comparator is responsive to a positive threshold signal typically supplied as a fixed data signal from select switches on a test equipment control panel. The first magnitude comparator provides a select positive logic signal as the data amplitude signal exceeds the positive threshold signal. The second magnitude comparator is configured to receive a negative threshold signal and provides a select negative logic signal at terminal 50 as the data amplitude penetrates the predetermined negative threshold signal limit.

The means for comparing successive sequential values of data signals on the data bus and for providing a positive slope logic signal for an increasing series of data signals and for providing a negative slope logic signal for a decreasing series of data signals is provided by circuitry represented by block 51. The peak and slope detect circuit represented by block 51 provides a positive slope logic signal and a negative slope logic signal (not shown), the select positive signal and the select negative signal are also used by the peak detector circuit 51 for providing a positive peak transfer enable signal and a negative peak transfer enable signal. The positive register 56 responds to the positive peak transfer enable signal to transfer and store successive peak values of the data signal from bus 40, delayed by 1 bit time. The negative register means 58 is responsive to the negative peak transfer enable signal to transfer and store the negative peak value of the data signal on bus 40 delayed by 1 bit time.

The width transfer control circuit 99 is armed by either the positive or negative channel transfer control signals from terminal 64 and 66 to provide respective positive and negative width transfer signals to positive and negative width registers 84 and 86 on lines 91 and 95 at the termination of the gate signal from the width transfer control logic block 90 on line 93.

CIRCUIT OPERATION

Figure 2:
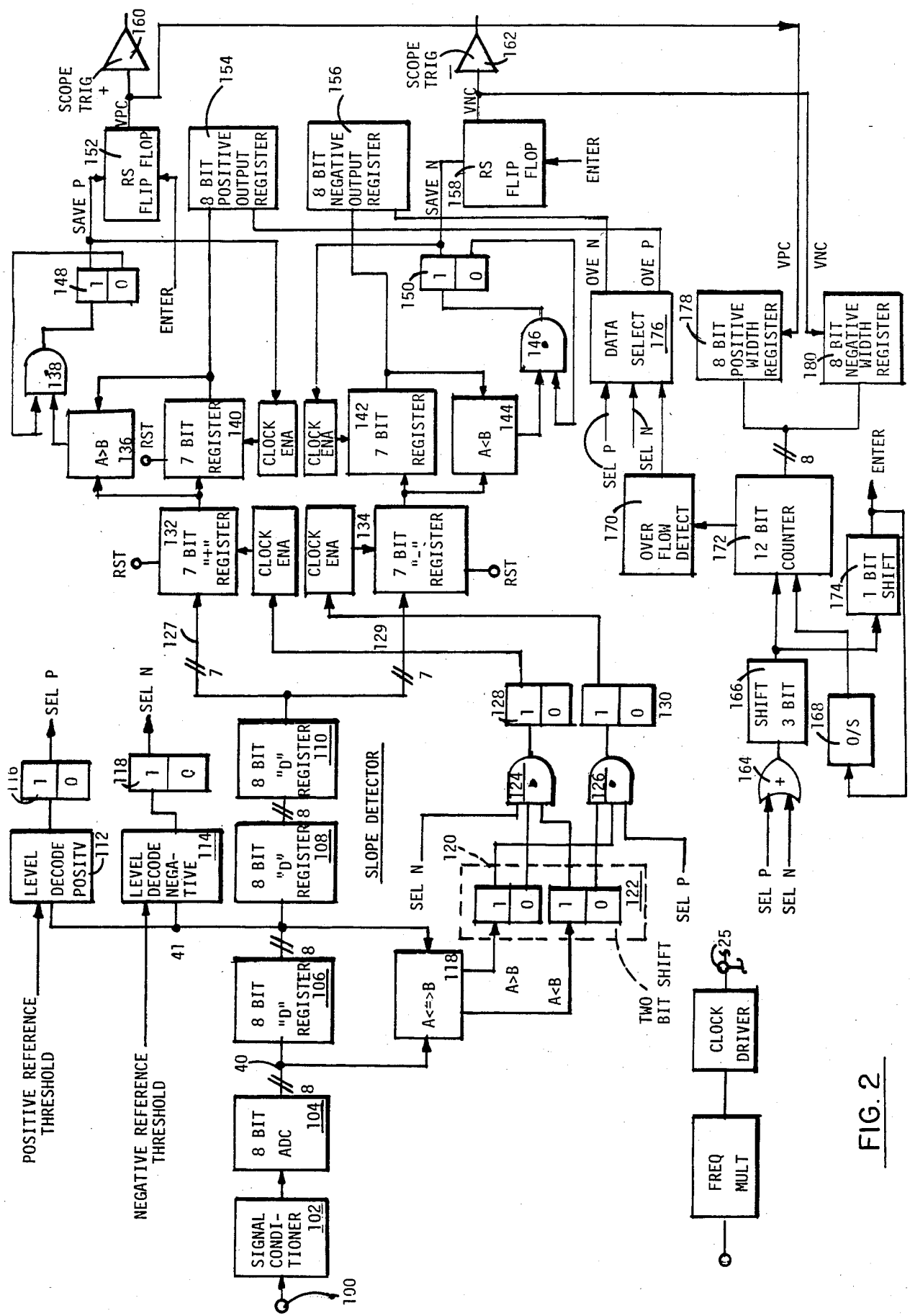
FIG. 2 is a comprehensive block diagram for the invention transient detector system.

Referring to FIG. 2, the signal to be processed is received at signal input terminal 100 by signal conditioner 102 using standard oscilloscope instrumentation probes attached to the signal conditioner 102. In a particular embodiment, the signal conditioner 102 had a bandwidth of 3 Hz to 6 MHz transients within this bandwidth are transformed to an 8 bit word by the 8 bit ADC 104 using a TRW TD1007 analog-to-digital converter device. The output of the 8 bit ADC was transferred to data bus 40 and processed to 8 bit D register 106. Eight bit D registers 108 and 110 sequentially process the information from register 106 to introduce a delay necessary for signal processing purposes.

The converter sampling rate is selectable from 3.2 MHz to 19 MHz. The ability to select the sampling rate enables the user to control the resolution of the system.

Data is transferred from data bus 40 to data bus 41 with a delay of 1 bit time. These two buses therefore make it possible to compare sequential samples of information appearing on data bus 40.

The slope detection circuitry is characterized by blocks identified by reference numbers 118, 120, 122, 124, 126, 128 and 130. Block 118 represents a magnitude comparator implemented typically by using a low power TTL 74LS86. Block 118 receives the next sample from data bus 40 and the last sample from data bus 41 concurrently and compares the respective magnitudes of these two data buses and provides an A B and an A B logic level to a 2 bit shift register symbolically represented by blocks 120 and 122.

Block 112 and block 114 represent magnitude comparators again implemented by use of 74LS86 devices. Block 112 and block 114 are shown coupled to 8 bit data bus 41 to measure the last value of the sampled data.

Level decode positive block 112 is shown coupled to a positive reference threshold establishing the maximum limit of positive excursions on data bus 8 required for providing an output to a timing flip flop represented by block 116. The output of the timing flip flop 116 characterizes a positive threshold penetration logic signal when the contents of data bus 41 exceeds the positive reference threshold, delay timing flip flop 116 is set thereby providing a negative threshold penetration logic signal shown as SEL P.

Level decode negative block 114 represents a magnitude comparator that senses a negative reference threshold level and the contents of data bus 41. As the contents of data bus 41 penetrates the predetermined negative reference threshold, delay timing flip flop 118 is set thereby providing a negative threshold penetration logic signal shown as SEL N.

Referring again to the outputs of the 2 bit shift register characterized by reference blocks 120 and 122, logic levels SEL P and SEL N are combined with the outputs of the 2 bit shift register in AND gates 124 and 126 for providing set signals to timing flip flops 128 and 130, respectively. Flip flops 128 and 130 provide logic signals characterizing respective positive and negative channel peak transient signals. The logic signal from timing flip flop 128 therefore a change in the sign of the time dependent derivative of the signal appearing on data bus 40. Correspondingly, timing flip flop 130 provides an output logic signal representing a change in the sign of the derivative of the time dependent signal appearing on data bus 40.

The output of D register 110 is fed to two 7 bit registers 127 and 129 to bring the content of D register 110 to 7 bit register 132 and 134, respectively. Upon the output of timing flip flops 128 and 130, representing respective positive and negative channel peak transient signals, transfer the contents from bus 127 and 129 into the appropriate positive or negative register. The value of positive transients are transferred into the plus register 132 and the value of negative transients are transferred into the minus register 134. In practice, the transfer enable blocks are true for only 1 bit time. Registers 140 and 142 represent a positive channel output register and a negative channel output register. Blocks 136 and 144, respectively represent magnitude comparators also implemented using 74LS86 devices. Registers 140 and 142 contain the values of the last largest transient signals. The value of each successive transient signal transferred from bus 127, 129 into plus register 132 and minus register 134 are compared with the contents of register 140 and register 142, respectively by magnitude comparators 136 and 144; thereby, enabling magnitude comparator blocks 136 and 144 to provide respective positive and negative channel transfer control logic signals. The output of magnitude comparators 136 and 144 are fed to AND gates 138 and 146, respectively and combined with outputs from timing flip flops and 150, respectively to develop logic signals referred to as SAVE P and SAVE N.

In this embodiment, RS flip flops 152 and 158, respectively are used for providing a positive transient scope trigger and a negative transient scope trigger at drivers 160 and 162, respectively. These triggers are used to trigger auxiliary test equipment for the purpose of photographing the transients detected by the transient detector system.

The counter and control means is characterized in this particular embodiment by the functions represented by blocks 164, 166, 168, 170, 172, 174, 176, 178, and 180. The width counter is represented by the contents of block 172 and is typically implemented by use of three each 74LS163 devices. The 8 bits of the output of the 12 bit counter 172 are fed to the positive transient noise signal width storage register represented by block 178 for positive transient noise signals and to a negative transient noise signal with storage register represented by the contents of block 180 for a negative transient signal.

When a transient noise signal duration exceeds the time allowed by the count of the 12 bit counter register 172, a bit is set and stored by overflow detect block 170. The output of block 170 is fed to data select block 176 along with the cell P and cell N terms for the purpose of routing an overflow bit to the most significant bit of the appropriate output register represented by blocks 154 and 156.

The functions represented by blocks 164 and 166 control timing synchronization between the pulse width measurement and the amplitude measurement for the purpose of synchronizing the arrival of transient amplitude information at the positive channel output register with timing width information at the positive width register and, correspondingly concurrent arrival of negative channel information also.

The SEL P and SEL N logic signals depicted in FIG. 2 correspond to the positive threshold penetration logic signal appearing at terminal 48 and the negative threshold penetration logic signal appearing at terminal 50. The SAVE P and SAVE N logic signals depicted in FIG. 2 correspond to the respective positive and negative transfer control logic signals at terminals 64 and 66 of FIG. 1. The VPC and VNC logic signals of FIG. 2 correspond to the logic signals appearing on lines 91 and 95 of FIG. 1 for the purpose of transferring information from the width counter 98 to the respective positive and negative width registers 84 and 86.

Blocks 174 and 168 control the reset of 12 bit counter 172 when the output of shift 3 bit block 166 signals the end of a positive or negative transient signal penetration of the positive or negative reference threshold.

Accordingly, there has been described a transient detector system for monitoring a voltage signal to detect positive and negative transient voltages on the voltage signal that penetrate a predetermined threshold band and to provide a first and second output signals characterizing the amplitude of the last largest respective positive and negative transient noise signal amplitudes penetrating the threshold band and to also provide third and fourth output signals characterizing the duration of the last largest positive and negative transient noise signals penetrating the predetermined threshold band. Although the invention has been disclosed and illustrated in detail, it is to be clearly understood that the same is by way of illustration and example only and is not to be taken by way of limitation, the spirit and scope of this invention being limited only by the terms of the appended claims.

I claim:

1. A transient detector system for monitoring a voltage signal to detect positive and negative transient voltages on said voltage signal, that penetrate a predetermined threshold band, said transient detector system receiving an external clock signal for synchronization with an external system from an external clock signal source at an external clock signal terminal, said transient detector system providing first and second output signals on output signal busses characterizing the amplitude of the last largest respective positive and negative transient noise signal amplitudes penetrating said threshold band, said transient detector system also providing third and fourth output signals on a positive width bus and on a negative width bus, said output signals respectively characterizing the pulse width of said last largest positive and negative transient noise signals, the transient detector system comprising;

an internal clock signal source for providing a system clock signal;

a signal conditioning circuit for scaling and for conditioning said voltage signal and for providing a sample signal at a sample signal terminal, and;

a digitizing circuit responsive to said system clock signal source for sampling and periodically digitizing the magnitude of said sample signal and for periodically providing a digital data signal on a data bus, each respective data signal representing the instantaneous amplitude of said sample signal, the sample rate of said digitizing circuit being characterized to be of a sufficiently high repetition rate to substantially follow the amplitude of positive and negative transient noise signals present on said sample signal;

positive and negative threshold detect circuit means responsive to said series of data amplitude signals on said data bus and to positive and negative threshold signals respectively for providing a positive threshold penetration logic signal as a positive transient voltage signal penetrates a predetermined positive threshold signal level, and for providing a negative threshold penetration logic signal as a negative transient voltage signal penetrates a predetermined negative threshold signal level;

a slope detect circuit means responsive to said data amplitude signal for determining if said data amplitude signal is changing with a positive or negative slope with respect to time and for providing a positive channel peak transient logic signal at a positive channel peak transient select terminal for a positive data amplitude bus signal changing from a positive slope to a negative slope, and a negative channel peak transient logic signal at a negative channel peak transient select terminal for a negative data amplitude signal changing from a negative slope to a positive slope;

a positive register means coupled to data amplitude bus and responsive to said positive threshold penetration logic signal and to said positive channel peak transient logic signal for loading and storing peak values of successive positive transient signals from said data amplitude signals on said data bus, and a negative register means coupled to said data bus and responsive to said negative threshold penetration logic signal and to said negative channel peak transient logic signal for loading and storing peak values of successive negative transient signals from said data amplitude signals on said data bus;

positive channel output register storage means for storing the peak amplitude of said last largest positive transient data signals;

a negative channel output register storage means for storing the peak amplitude of said last largest negative transient data signals;

a positive compare circuit means coupled to said positive register and to said positive channel output register storage means for comparing the peak value of successive positive transient signals with said last largest positive transient signal and for replacing the contents of said positive channel output register with the contents of said positive channel register when the peak value of the contents of said positive register exceeds the value of the contents of said positive channel output register and for providing a positive channel width transfer control signal to signal that the value of said positive transient signal exceeds the value of said last largest positive transient signal, and a negative compare circuit means coupled to said negative register and to said negative channel output register storage means for comparing the peak value of successive negative transient signals with said last largest negative transient signal and for replacing the contents of said negative channel output register with the contents of said negative channel register when the peak negative value of said negative channel register exceeds the value of said negative channel output register and for providing a negative channel width transfer control signal to signal that the value of said negative transient signal exceeds the value of said last largest negative transient signal;

timing circuit means responsive to said positive threshold penetration logic signal and to said negative threshold penetration logic signal and to said system clock signal for measuring the width of each successive positive and negative transient noise signal penetration of said predetermined threshold band and for outputting said third and fourth output signals in response to said positive and negative channel width transfer control signals;

whereby, said transient detector system positive and negative channel output registers respectively contain the values of the amplitudes of said last largest positive and negative transient signals, and said positive and negative transient noise signal width registers respectively contain the respective widths of said largest last positive and negative transient signals.

2. The transient detector system of claim 1, wherein said timing means further comprises:

a positive transient noise signal width storage register;

a negative transient noise signal width storage register;

counter and control means for measuring the width of each successive positive and negative transient noise signal that exceeds said predetermined threshold band, said counter and control means being responsive to said positive channel transfer control logic signal and to said positive threshold penetration logic signal for transferring the value of the width of a positive transient noise signal from said timing means to said positive transient noise signal width storage register and, to said negative channel transfer control logic signal and to said negative threshold penetration logic signal for transferring the value of the width of said negative transient noise signal from said timing means to said negative transient noise signal width storage register.

3. The transient detector system of claim 2, wherein said control means further comprises:

a width transfer control circuit,
a positive width gate circuit,
a negative width gate circuit,
a width transfer control logic circuit, and
a width counter,
- said positive width gate circuit being responsive to said positive threshold penetration logic signal to provide a positive width gate signal,
- said negative width gate circuit being responsive to said negative threshold penetration logic signal for providing a negative width gate signal,
- said width transfer control logic circuit being responsive to said positive width gate signal or to said negative width gate signal for providing a counter width gate signal,
- said width transfer control circuit being responsive to said positive transfer control logic signal and to said negative transfer control logic signal and to said width gate signal for providing a positive width transfer control signal and a negative width transfer control signal,
- said width counter being responsive to said internal clock signal from said internal clock signal source and being enabled by said counter width gate signal to count during the time interval characterized by the presence of said counter width gate signal, said width counter providing a width count output to said positive width register and to said negative width register,
- said positive width register being responsive to said positive width transfer signal to transfer and store the value of said width count output signal,
- said negative width register being responsive to said negative width transfer signal to transfer and store the width count output signal.

4. The transient detector system of claim 1 wherein said positive and negative threshold detect circuit means further comprises: first and second magnitude comparators,
said first and second mangitude comparators being responsive to said data amplitude signals on said data bus,
- said first magnitude comparator also being responsive to a positive threshold signal, said first magnitude comparator providing a select positive logic signal as said data amplitude signal exceeds said positive threshold signal,
- said second magnitude comparator also being responsive to a predetermined negative threshold signal, said second magnitude comparator providing a select negative logic signal as said data amplitude penetrates said predetermined negative threshold signal,
means for comparing successive, sequential values of said data signal on said data bus and for providing a positive slope logic signal for an increasing series of data signals and for providing a negative slope logic signal for a decreasing series of data signals,
peak detector circuit means responsive to said positive slope logic signal, said negative slope logic signal, said select positive signal and said select negative signal for providing a positive peak transfer enable signal and a negative peak transfer enable signal, said positive register means being responsive to said positive peak transfer enable signal to transfer and store successive peak values of said data signal,
said negative register means being responsive to said negative peak transfer enable signal to transfer and store negative peak values of said data signal.

5. The transient detector system of claim 3 wherein said width transfer control circuit is armed by said positive or negative transfer control logic signals to provide a respective positive or negative width transfer control signal at the termination of said counter width gate signal.

6. The transient detector system of claim 1, further comprising:
means for resetting the contents of said positive channel output register and of said negative channel output register.

* * * * *